United States Patent [19]

Jasinski

[11] Patent Number: 5,054,113
[45] Date of Patent: Oct. 1, 1991

[54] COMMUNICATION SYSTEM WITH BIT SAMPLING METHOD IN PORTABLE RECEIVER FOR SIMULCAST COMMUNICATION

[75] Inventor: Leon Jasinski, Ft. Lauderdale, Fla.

[73] Assignee: Motorola, Inc., Schaumburg, Ill.

[21] Appl. No.: 445,210

[22] Filed: Dec. 4, 1989

[51] Int. Cl.$^5$ .............................................. H04B 7/00
[52] U.S. Cl. ........................................ 455/51; 455/57; 455/105
[58] Field of Search ....................... 455/16, 38, 51, 70, 455/103, 52, 103, 105, 57; 375/11, 40; 340/825.14, 825.74

[56] References Cited

U.S. PATENT DOCUMENTS

| | | | |
|---|---|---|---|
| 4,034,295 | 7/1977 | Kotezawa et al. | 455/51 |
| 4,208,630 | 7/1980 | Martinez | 455/51 |
| 4,255,814 | 3/1981 | Osborn | 455/51 |
| 4,612,594 | 9/1986 | Yamaura et al. | 455/51 |
| 4,696,052 | 9/1987 | Breeden | 455/51 |
| 4,709,402 | 11/1987 | Akerberg | 455/51 |

*Primary Examiner*—Reinhard J. Eisenzopf
*Assistant Examiner*—Andrew Faile
*Attorney, Agent, or Firm*—Daniel R. Collopy; Vincent B. Ingrassia; William E. Koch

[57] ABSTRACT

Receivers synchronize to signals sequentially transmitted from several transmitters prior to receiving signals simulcast by the transmitters. The relative delay differential of the received sequential signals is measured and used to determine the optimal sampling positions for the simulcast signals.

20 Claims, 5 Drawing Sheets

COMMUNICATION SYSTEM WITH BIT SAMPLING METHOD IN PORTABLE RECEIVER FOR SIMULCAST COMMUNICATION

FIELD OF THE INVENTION

This invention relates in general to simulcast communication systems, and more specifically to a method of synchronizing one or more receivers prior to receiving a simulcast transmission.

BACKGROUND OF THE INVENTION

In contemporary communication systems, transmitter simulcasting is frequently utilized to expand the geographic area in which receivers may receive an information signal. Regrettably, however, by focusing upon simultaneous transmission of the information signals, existing simulcast systems have not fully addressed the effects of differential delay of the received simulcast signals. Differential delay arises when a receiver receives simulcast signals from multiple transmitters that are substantially identical in composition, but are shifted (in time) with respect to one another. As communication systems employ higher data rates to maximize information throughput, the acceptable differential delay between signals received from multiple transmitters is reduced and tolerance to timing error minimized. Accordingly, a need exists to compensate for differential delay effects in a simulcast communication system without unduly impeding information throughput.

SUMMARY OF THE INVENTION

Briefly, according to the invention, receivers synchronize to signals sequentially transmitted from several transmitters prior to receiving a signal simulcast by the transmitters.

DETAILED DESCRIPTION OF THE INVENTION

Figure 1:
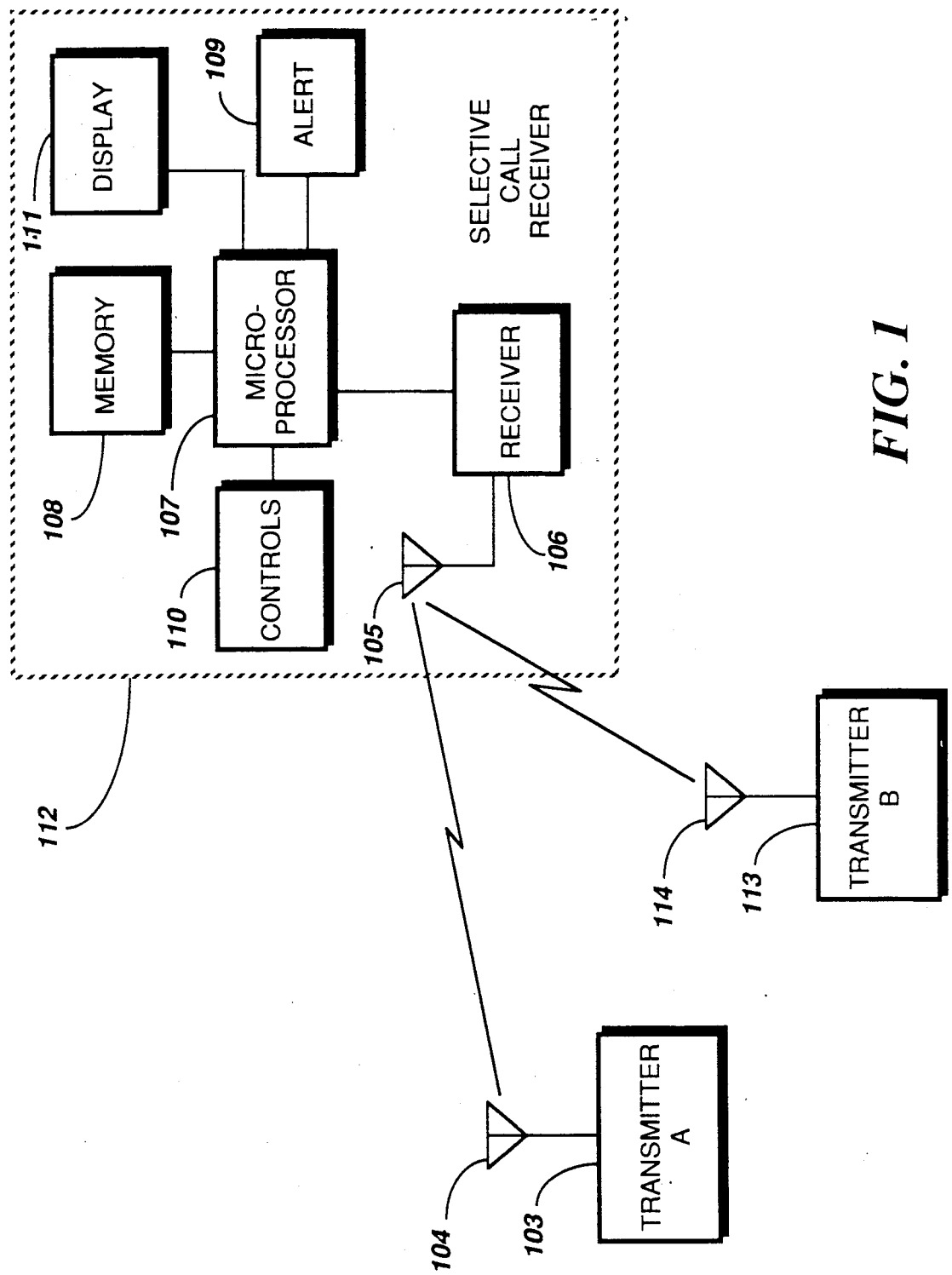
FIG. 1 is a block diagram of a simulcast communication system suitable for use with the present invention.

Referring to FIG. 1, a block diagram of a simulcast communication system comprises at least two transmitter sites, each transmitter site comprising a transmitter and an antenna such as a transmitter A 103 and an antenna 104 and a transmitter B 113 and an antenna 114. Radio frequency signals are sent from the transmitter sites over the air to at least one selective call receiver (SCR) such as a SCR 112. The radio frequency signals are typically modulated by a digital signal comprised of: (a) a synchronization signal portion for the purpose of synchronizing the SCR's in the system and (b) an address and message data portion.

A typical SCR 112 receives the modulated radio frequency signals from the air through an antenna 105. The signals are conducted to a receiver 106, where the address and data portions are recovered and provided to a microprocessor 107. The recovered address is compared to one or more addresses stored in a memory 108. If there is a match, the message data is stored in the memory 108, and an alert 109 is activated to inform the SCR user of a received message. The stored message may then be displayed on a display 111 either automatically or by actuation of one or more controls 110.

Figure 2:
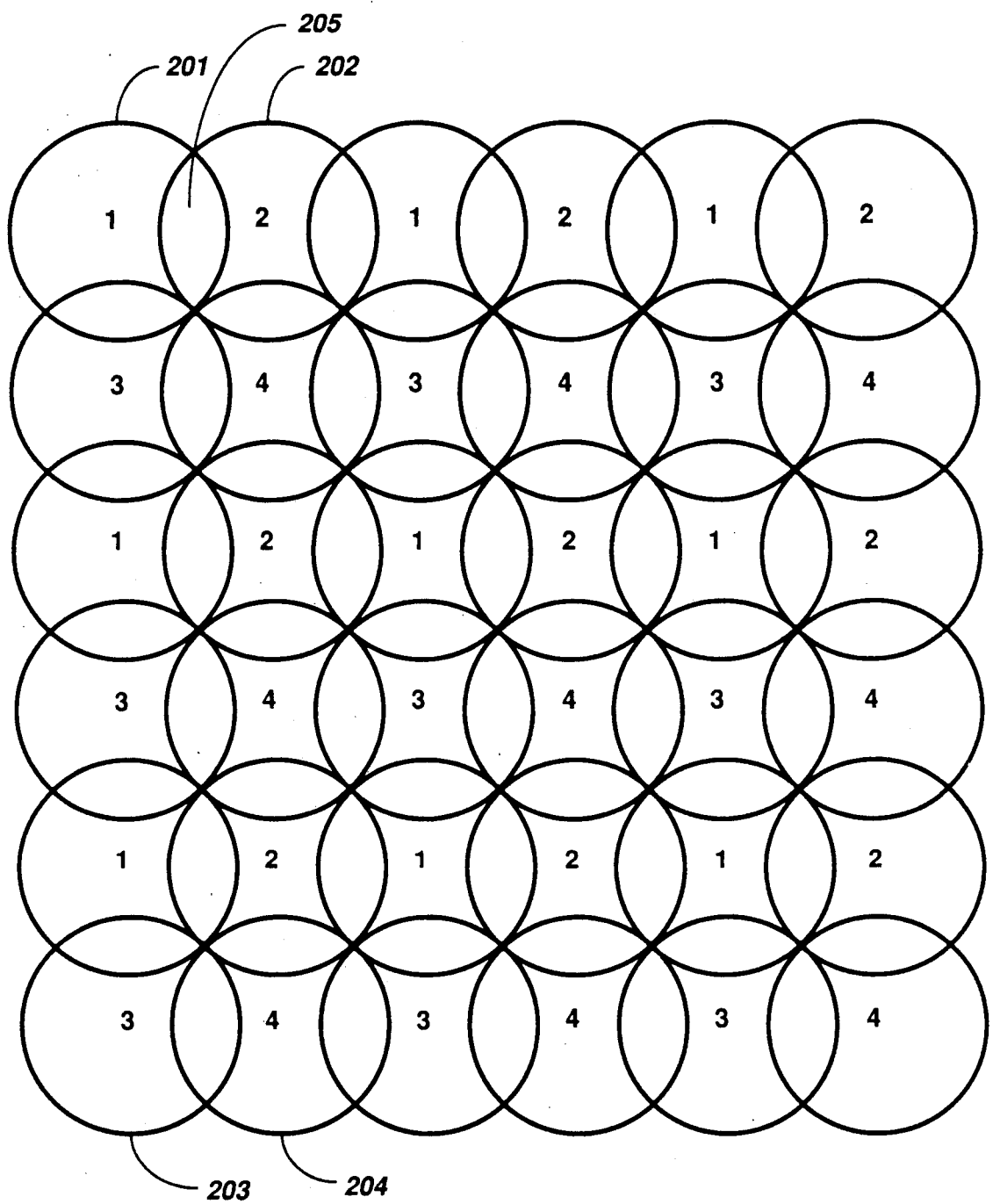
FIG. 2 is a transmitter coverage map in accordance with the present invention.

Referring to FIG. 2, a transmitter coverage map in accordance with the present invention comprises an arrangement of a plurality of transmitter coverage areas, each represented in FIG. 2 by a circle and a number at the center. In accordance with the present invention, a transmitter such as the transmitter A 103 or transmitter B 113 is located at the center of each of the circular areas to provide radio frequency coverage for each particular area. The transmitters and their coverage areas comprise a predetermined number of groups; in FIG. 2, the predetermined number of groups is four, although it may be a different number. Typical coverage areas 201, 202, 203, and 204 are shown for transmitters within group one (1), group two (2), group three (3), and group four (4), respectively. An overlapping coverage area 205 is shown. Within the geographical area 205, transmissions from the transmitter for the coverage area 201 and the transmitter for the coverage area 202 may be received. The groups of transmitters are arranged in a manner that prevents simultaneous receipt of more than one signal from any particular group. In other words, in FIG. 2, like circles never intersect.

Figure 3:
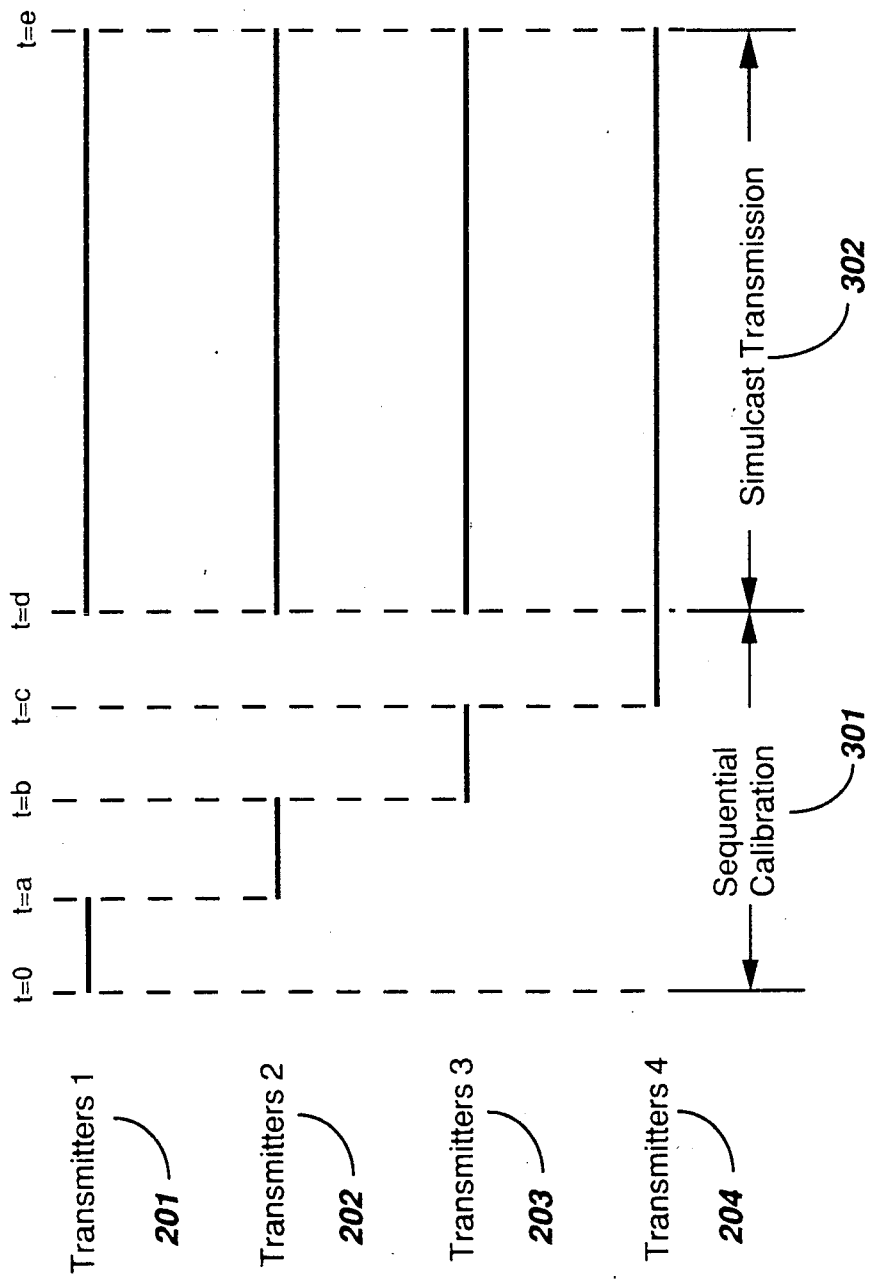
FIG. 3 is a timing diagram illustrating the signal transmission process in accordance with the present invention.

Referring to FIG. 3, a timing diagram illustrating the signal transmission process comprises signals from each of the four groups of transmitters. The signals include a sequential calibration 301 and a simulcast transmission 302. During the sequential calibration 301, the four transmitter groups sequentially broadcast a calibration signal over the air to the SCR's in the system. The calibration signal may comprise a synchronization signal portion for time-synchronizing the SCR's. The calibration signal may also be used to determine which signals are of sufficient strength to be further considered by a particular SCR. If, for example, a particular SCR is located within the geographical area 205, (FIG. 2) the SCR may, following the sequential calibration 301, determine that the received calibration signals from transmitter groups three and four are weak relative to those from transmitter groups one and two. The SCR may, then, decide to consider calibration signals only from transmitter groups one and two.

The simulcast transmission 302 may comprise, for all of the transmitter groups in the system, an identical address and message data portion that may include addresses of and data messages for particular ones of the SCR's in the system.

Figure 4:
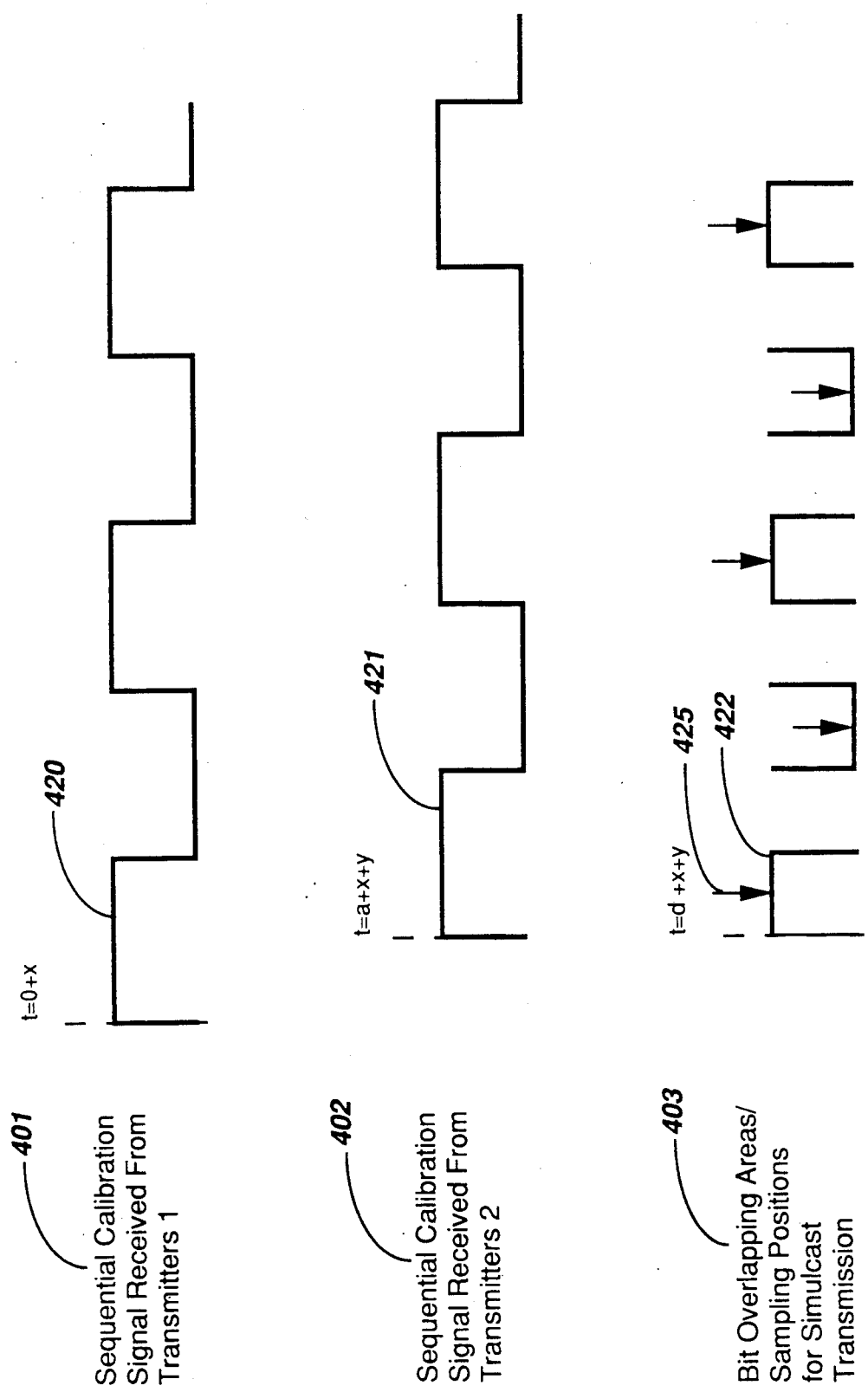
FIG. 4 is a timing diagram illustrating the bit-sampling process in accordance with the present invention.

Referring to FIG. 4, a timing diagram illustrating the bit-sampling process comprises typical sequential calibration signals received by a selective call receiver from transmitter groups one (1) 401 and two (2) 402. As shown in FIG. 4, a bit 420 of the signal 401 is received by the SCR 112 at time $t = 0 + x$, where $t = 0$ is the time of broadcast from the transmitter and x is a time delay due to factors such as propagation delay. If the delay in travel from transmitter to SCR were equal for signals 401 and 402, the SCR would begin receiving the bit 420 and a bit 421 of the signal 402 at time $t = a + x$. However, as shown in FIG. 4, the bit 421 is delayed by an additional amount of time y due to the signal 402 travelling a longer distance to the SCR because the SCR is located closer to a group one transmitter than a group two transmitter or because the signal 402 is reflected off an object (e.g., a building) prior to reaching the SCR. It is assumed in the example of FIG. 4 that the signals from transmitter groups three and four are very weak relative to signals 401 and 402 and are, therefore, rejected by the SCR. In accordance with the present invention, the sampling times for the simulcast transmission portion of the received signal are adjusted within the selective call receiver based on the overlapping portions of the time-shifted bits 420 and 421. Specifically, as shown at signal 403, the bit-sampling process comprises sampling each bit within the overlapping portions 422 of the bits 420 of the signal 401 and the bits 421 of the signal 402. The adjusted sampling times may occur relative to the midpoint of the common overlapping portions, 425. In the example shown in FIG. 4, the first overlapping portion 422 begins at time $t=d+x+y$. The arrows shown indicate sampling time 425 as determined by the received signals 401 and 402.

Figure 5:
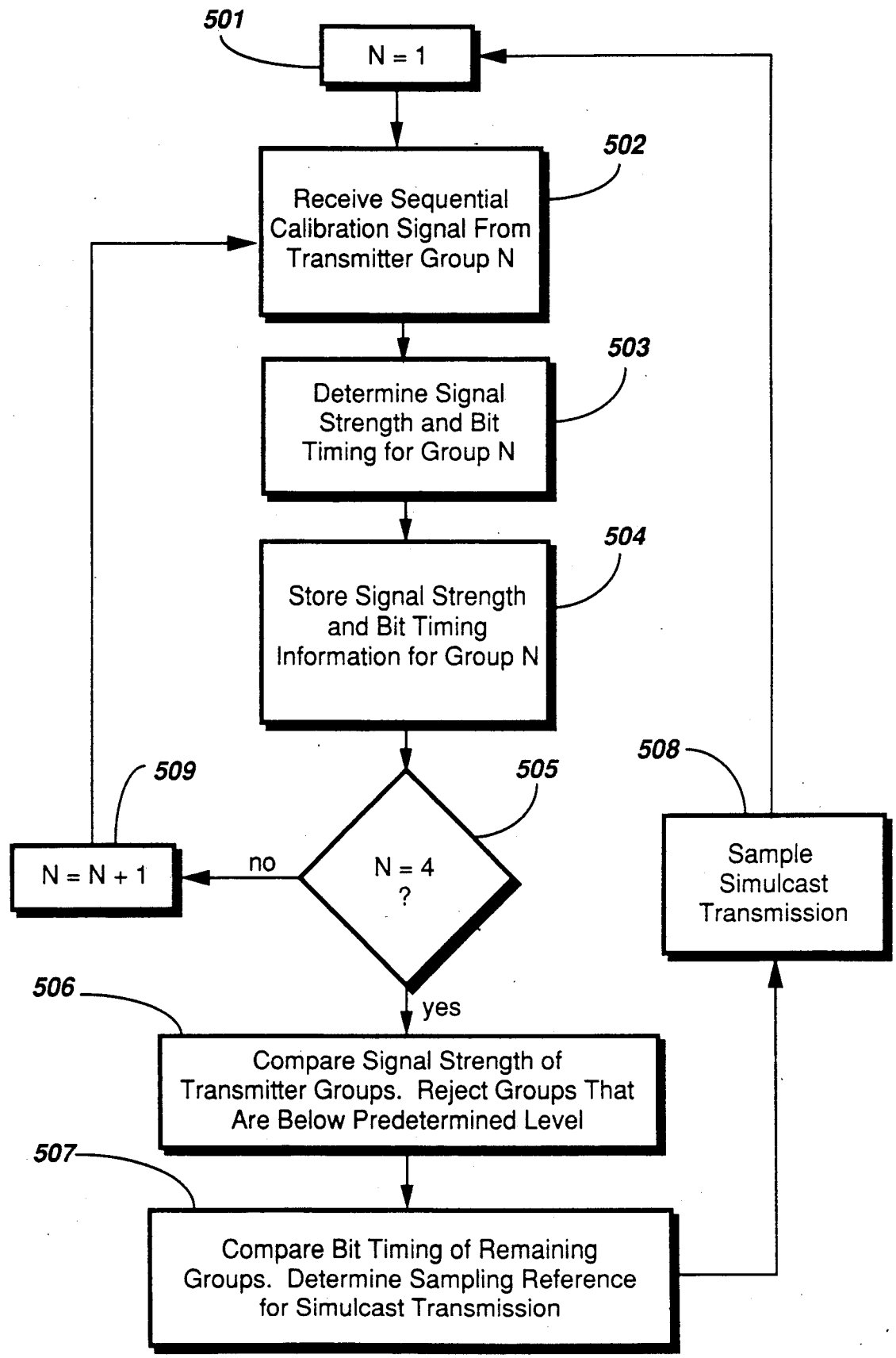
FIG. 5 is a flow diagram in accordance with the present invention.

Referring to FIG. 5, a flow diagram in accordance with the present invention comprises setting a counter $N=1$, step 501. The process then proceeds to step 502 in which the sequential calibration signal is received from transmitter group N. In step 503, the signal strength and bit timing for the group N transmitter are determined. Next, the signal strength and bit timing information for the group N transmitter is stored in the memory 108 of the SCR 112, step 504, and the counter N is checked to see if it is equal to four (4), step 505.

If the counter N is not equal to four in step 505, the counter N is incremented by one ($N=N+1$), step 509, and the process returns to step 502. If the counter N is equal to four in step 505, the signal strength of all transmitter groups is compared and the groups that are below a predetermined level are rejected, step 506. The predetermined level in step 506 may comprise a level relative to the strongest received signal or, alternatively, an absolute signal strength level. Next, the bit timing of the remaining groups is compared and the sampling reference for the following simulcast transmission is determined, by selecting the center 425 of the overlapping bits 422 created by the bits 420 of the signal 401 and the bits 421 of the signal 402 (FIG. 4) step 507. The simulcast transmission is then received and sampled, step 508, and the process returns to step 501.

I claim:

1. A method for calibrating a simulcast communication system comprising at least two transmitting sites and at least one selective call receiver, the method comprising the steps of:
   (a) sequentially transmitting from each of said at least two transmitting sites a predetermined signal to provide sequentially transmitted signals;
   (b) receiving said sequentially transmitted signals by said at least one selective call receiver to provide received sequential signals;
   (c) determining to what extent said received sequential signals overlap;
   (d) transmitting a simulcast signal from said at least two transmitting sites; and
   (e) receiving said simulcast signal by sampling said simulcast signal by a receiving means of said at least one selective call receiver at sample times determined in accordance with step (c).

2. The method according to claim 1 wherein step (c) comprises the steps of:
   (f) comparing received signal strength of said received sequential signals with a predetermined received signal strength;
   (g) rejecting those of said received sequential signals which have said received signal strength below said predetermined received signal strength; and
   (h) determining to what extent those of said received sequential signals not rejected overlap.

3. The method according to claim 1 wherein said sample times are a midpoint of said overlap times.

4. The method according to claim 1 wherein said sequentially transmitted signals and said simulcast signal comprise radio frequency signals.

5. The method according to claim 4 wherein said radio frequency signals comprise modulation, said modulation comprising an address of said at least one selective call receiver.

6. The method according to claim 5 wherein said modulation further comprises data representing a message for said at least one selective call receiver.

7. An apparatus for receiving a simulcast signal from a plurality of transmitters, said apparatus comprising:
   first means for receiving said simulcast signal and calibration signals, said calibration signals comprising sequential signals transmitted sequentially from said plurality of transmitters;
   second means coupled to said first means for determining to what extent said calibration signals overlap;
   third means coupled to said first means for sampling said simulcast signal at sampling times; and
   fourth means, coupled to said first means and said second means, for adjusting said third means by adjusting said sampling times in response to the extent said calibration signals overlap.

8. The apparatus according to claim 7 further comprising;
   fifth means for determining received signal strengths of said calibration signals; and
   sixth means for rejecting those of said calibration signals which said received signal strengths are below a predetermined signal strength.

9. The apparatus according to claim 7 wherein said calibration signals and said simulcast signal comprise radio frequency signals.

10. The apparatus according to claim 9 wherein said radio frequency signals comprise modulation, said modulation comprising an address of at least one selective call receiver.

11. The apparatus according to claim 10 wherein said modulation further comprises data representing a message for said at least one selective call receiver.

12. An apparatus for receiving a simulcast signal from a plurality of transmitters, said apparatus comprising:
   first means for receiving said simulcast signal and calibration signals, said calibration signals comprising sequential signals transmitted sequentially from said plurality of transmitters;
   second means coupled to said first means for determining to what extent said calibration signals overlap;
   third means coupled to said first means for sampling said simulcast signal at sampling times; and
   fourth means, coupled to said first means and said second means, for adjusting said third means by adjusting said sampling times to sample said simulcast signal at overlap times, said overlap times determined in response to the extent of said calibration signals overlap.

13. The apparatus according to claim 12 wherein said fourth means adjusts said sampling times to sample said simulcast signal at a midpoint of said overlap times.

14. An apparatus for receiving a simulcast signal, said apparatus comprising:
   first means for receiving the simulcast signal;
   second means for receiving sequential calibration signals to provide received sequential signals; and
   third means coupled to said second means and said first means for calibrating said first means by comparing said received sequential signals and determining sampling times therefrom for sampling said simulcast signal.

15. The apparatus according to claim 14 wherein said sampling times are in response to a midpoint of an overlap of said received sequential signals.

16. The apparatus according to claim 14 wherein said received sequential signals and said simulcast transmission comprise radio frequency signals.

17. The apparatus according to claim 16 wherein said simulcast signal comprises modulation, said modulation comprising an address of said apparatus.

18. The apparatus according to claim 17 wherein said modulation further comprises data representing a message for said apparatus.

19. The apparatus according to claim 12 wherein said second means comprises:
   fifth means for determining received signal strengths of said calibration signals;
   sixth means for rejecting those of said calibration signals which said received signal strengths are below a predetermined signal strength; and
   seventh means for determining to what extent said calibration signals overlap.

20. The apparatus according to claim 14 wherein said third means comprises:
   fourth means for determining received signal strengths of said received sequential signals;
   fifth means for rejecting those of said received sequential signals which are below a predetermined signal strength; and
   sixth means for calibrating said first means by comparing those of said received sequential signals having said received signal strengths above said predetermined signal strength and determining therefrom sampling times for said receiving of said simulcast signal.

* * * * *